(12) United States Patent
Sheats et al.

(10) Patent No.: US 6,965,361 B1
(45) Date of Patent: Nov. 15, 2005

(54) METHOD OF MANUFACTURE OF ACTIVE MATRIX ADDRESSED POLYMER LED DISPLAY

(75) Inventors: James R. Sheats, Palo Alto, CA (US); Mark R. Hueschen, Palo Alto, CA (US); Ronald L. Moon, Atherton, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 1115 days.

(21) Appl. No.: 09/098,190

(22) Filed: Jun. 16, 1998

(51) Int. Cl.[7] .............................. G09G 3/32; G08B 5/22
(52) U.S. Cl. .................................... 345/82; 340/815.45
(58) Field of Search ............................ 345/44, 46, 82, 345/83, 205, 206, 209; 252/512; 257/40, 257/88, 292, 324; 340/701, 301, 815.45; 357/17; 358/213.19; 438/166; 313/504, 506, 313/511

(56) References Cited

U.S. PATENT DOCUMENTS

| | | | | |
|---|---|---|---|---|
| 5,099,301 A | * | 3/1992 | Kikinis ....................... 257/379 |
| 5,121,214 A | * | 6/1992 | Turko et al. ................ 348/249 |
| 5,142,343 A | * | 8/1992 | Hosokawa et al. ......... 257/103 |
| 5,180,523 A | * | 1/1993 | Durand et al. .............. 252/512 |
| 5,184,114 A | * | 2/1993 | Brown ........................ 340/701 |
| 5,294,820 A | * | 3/1994 | Gemma et al. ............. 257/324 |
| 5,424,560 A | * | 6/1995 | Norman et al. ............... 257/40 |
| 5,719,589 A | * | 2/1998 | Norman et al. ............... 345/82 |
| 5,789,766 A | * | 8/1998 | Huang et al. .................. 257/88 |
| 5,818,404 A | * | 10/1998 | Lebby et al. .................. 345/82 |
| 5,834,893 A | * | 11/1998 | Bulovic et al. ............. 313/506 |
| 5,844,363 A | * | 12/1998 | Gu et al. .................... 313/506 |
| 5,903,246 A | * | 5/1999 | Dingwall ..................... 345/82 |
| 5,920,080 A | * | 7/1999 | Jones .......................... 257/40 |
| 5,929,474 A | * | 7/1999 | Huang et al. ................ 257/292 |
| 5,952,778 A | * | 9/1999 | Haskal et al. ................ 313/504 |
| 5,969,376 A | * | 10/1999 | Bao ............................. 257/40 |
| 5,970,318 A | * | 10/1999 | Choi et al. ..................... 438/99 |
| 5,994,174 A | * | 11/1999 | Carey et al. ................. 438/166 |
| 6,023,073 A | * | 2/2000 | Strite .......................... 257/40 |
| 6,046,543 A | * | 4/2000 | Bulovic et al. ............. 313/504 |

* cited by examiner

Primary Examiner—Bipin Shalwala
Assistant Examiner—Jeff Piziali

(57) ABSTRACT

A display having a plurality of light emitting pixels. Each pixels includes an isolation transistor, a driving circuit, and an organic light emitting diode (OLED). The driving circuit storing a value that determines the magnitude of the light emitted by that pixels, the driving circuit placing the OLED in a conducting path between the first and second power terminals. The driving circuit is programmed through the isolation transistor. In one embodiment of the present invention, the driving circuit includes a storage capacitor and a driving transistor. The OLEDs are part of an array of OLEDs. The array of OLEDs is constructed on a flexible sheet having first and second surfaces, the flexible sheet being transparent to light of a first wavelength. A transparent first electrode layer is in contact with the first surface. A light emitting layer including an organic polymer is in contact with the first electrode layer. A plurality of second electrodes, one such second electrode corresponding to each of the OLEDs, is in contact with the light emitting layer. Each second electrode has an isolated conducting area. The driving transistor are part of a transistor array having a plurality of connection points disposed on a surface, each connection point corresponding to one of the second electrodes in the array of OLEDs. The connection points are arranged such that each second electrode overlies the corresponding connection point when the array of OLEDs is properly aligned with the transistor array. The connection points are bonded to the corresponding second electrodes by a bonding layer.

8 Claims, 3 Drawing Sheets

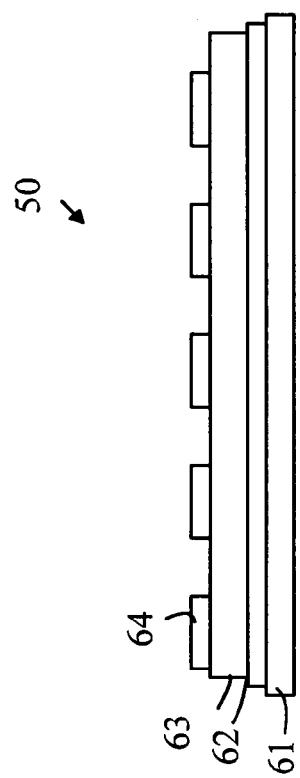
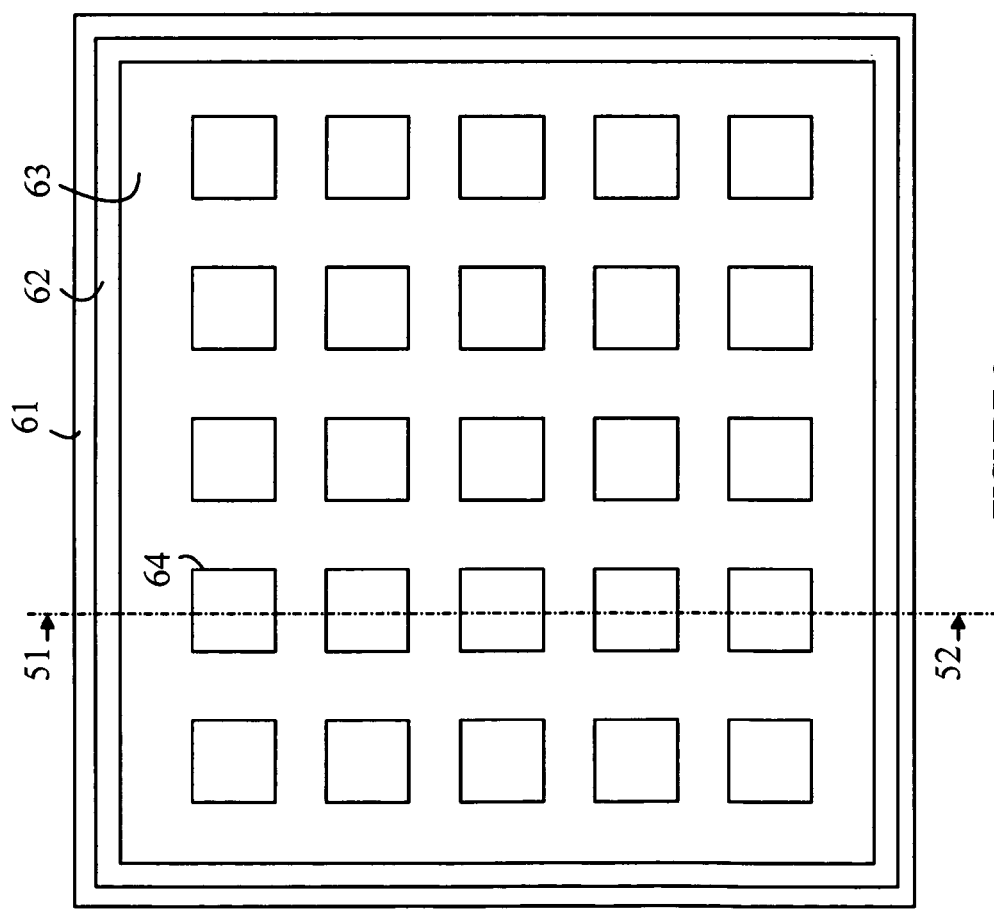

METHOD OF MANUFACTURE OF ACTIVE MATRIX ADDRESSED POLYMER LED DISPLAY

FIELD OF THE INVENTION

The present invention relates to display devices, and more particularly, to information displays using organic electroluminescent materials and thin film field effect transistors.

BACKGROUND OF THE INVENTION

Active matrix liquid crystal displays for computers and the like provide significantly improved performance; however, the cost of such displays is also a significant factor in the overall price of portable computers using the same. In addition, active matrix displays require substantially more power than passive displays since this type of display utilizes backlighting.

An active matrix liquid crystal display is constructed from two components that are separately constructed and then bonded together. The first component consists of an array of thin film transistors (TFTs) fabricated on a glass substrate, one per pixel. Each TFT has an associated capacitor which stores a potential value which is then applied to a liquid crystal element which passes a fraction of the light incident thereon, depending on the applied voltage. The TFTs are connected by transparent row and column electrodes, which are used to select each pixel. The liquid crystal layer together with color filters are fabricated on a second glass substrate. An adhesive is screen-printed around the edge of one glass plate, and an optical aligner is then used to bring the two together with the TFTs aligned to the filters. The adhesive is then UV (ultraviolet) cured and the liquid crystal material introduced by capillary action. The polarizers and a backlight are attached to the outside of the display.

Displays based on organic light emitting devices (OLEDs) have the potential for substantially reducing the cost of computer displays. OLEDs are emissive displays that provide an alternative to other types of light emission, such as vacuum fluorescence, plasma, inorganic electroluminescense, and inorganic light emitting diodes. Since a pixel only draws power when "on", a display based on OLEDs requires less power than a backlight-based display.

OLEDs are constructed on a transparent substrate coated with a transparent conducting material, such as Indium Tin oxide (ITO), one or more organic layers and a cathode made by evaporating or sputtering a metal of low work function characteristics, such as Ca or Mg. The organic layers are chosen so as to provide charge injection and transport from both electrodes to the electroluminescent organic layer (EL) where the charges recombine emitting light. Often there is at least one or two organic hole transport layers (HTL) between the ITO and the EL, as well as at least one or two electron injection and transporting layers (EL) between the cathode and the EL.

While OLEDs have the potential for reducing display costs, prior art methods for fabricating OLEDs have several disadvantages when applied to active matrix displays. In principle, a set of TFTs and conductors on a substrate can also be utilized for constructing an active matrix display based on OLEDs. After constructing the TFTs the pixels are defined by depositing a patterned conductor corresponding to either the cathode or anode of the OLED. The organic light emitting layers and associated transport layers are then deposited, followed by a uniform layer of the other OLED electrode (anode or cathode). Such structures are described in detail in Eugene Y. Ma, et al., *Soc. Inform. Display Conf. Proc.* Sep. 15–19, 1997 (Toronto, Canada), p.L78.

While such a process has the potential to produce useful displays which may be competitive with AMLCDs, it has several disadvantages. First, the processing of the organic LED must be done on the same substrate as used for the TFTs, typically glass. As a result, the large cost advantages associated with fabricating polymer LEDs on flexible plastic substrates with roll-to-roll equipment cannot be realized. Ma, et al., attempt to overcome this limitation by using stainless steel foil as a substrate. In this method, the TFTs and OLEDs are constructed as described in the previous paragraph, using stainless steel foil in place of glass. However, since this substrate is opaque, the top electrode of the OLED must be transparent. The preferred transparent electrode material is indium tin oxide (ITO) which is deposited by sputtering. Hence, the method suggested by Ma, et al. requires the active organic layers to be subjected to the hostile conditions associated with the sputtering of the ITO. This leads to damage of the active polymer layers. In addition, this architecture requires the organic material to be deposited on top of the cathode. However, the cathode must be constructed from a low work function material such as Ca or Mg which is easily oxidized.

Broadly, it is the object of the present invention to provide an improved OLED-based active matrix display.

It is a further object of the present invention to provide an OLED-based active matrix display that can be fabricated utilizing roll-to-roll processing techniques on polymer films.

It is a still further object of the present invention to provide an OLED-based active matrix display which does not require the deposition of the transparent electrode onto the already deposited organic layers.

These and other objects of the present invention will become apparent to those skilled in the art from the following detailed description of the invention and the accompanying drawings.

SUMMARY OF THE INVENTION

The present invention is a display having a plurality of light emitting pixels. Each pixel includes an isolation transistor, a driving circuit, and an organic light emitting diode (OLED). The driving circuit stores a value that determines the magnitude of the light emitted by that pixel, the driving circuit placing the OLED in a conducting path between first and second power terminals. The driving circuit is programmed through the isolation transistor. The isolation transistor connects the driving circuit to a bit line when the isolation transistor is placed in a conducting state by the application of a logic signal to a word line. In one embodiment of the present invention, the driving circuit includes a storage capacitor and a driving transistor, the storage capacitor storing a charge that determines the magnitude of the light emitted by the pixel. The gate of the driving transistor is connected to the storage capacitor, the driving transistor connecting the OLED between the first and second power terminals. In this embodiment, the isolation transistor connects the storage capacitor to the bit line when the isolation transistor is placed in the conducting state by the application of the logic signal to the word line. The OLEDs are part of an array of OLEDs. The array of OLEDs is constructed on a flexible sheet having first and second surfaces, the first and second surfaces being parallel to one another, the flexible sheet being transparent to light of a first wavelength. A first electrode layer is in contact with the first surface, the first electrode layer being transparent to light of the first wavelength. A light emitting layer including an organic polymer is in electrical contact with the electrode layer. A plurality of second electrodes, one such second electrode corresponding to each of the OLEDs, is in electrical contact with the light emitting layer. Each second electrode has an isolated conducting area in electrical contact with the light emitting layer, the light emitting layer generating light of the first wavelength in a region adjacent to the second electrode when a potential difference is applied across the first and second electrodes. The driving transistors are part of a transistor array having a plurality of connection points disposed on a surface, each connection point corresponding to one of the second electrodes in the array of OLEDs. The connection points are arranged such that each second electrode overlies the corresponding connection point when the array of OLEDs is properly aligned with the transistor array. The display includes a bonding layer located between the transistor array and the array of transistors, the bonding layer electrically connecting each of the second electrodes to that second electrodes corresponding connection point.

BRIEF DESCRIPTION OF THE DRAWINGS

FIG. 2 is a top view of an OLED array according to the present invention.

FIG. 3 is a cross-sectional view of the array shown in FIG. 2 through line 51–52.

DETAILED DESCRIPTION OF THE INVENTION

The present invention overcomes the problems associated with the above described prior art methods by utilizing a laminating technique that allows an OLED-based sheet of light emitting diodes formed on a flexible plastic substrate to be laminated onto a solid TFT substrate. In this manner, the cost advantages associated with OLEDs are preserved.

Figure 1:
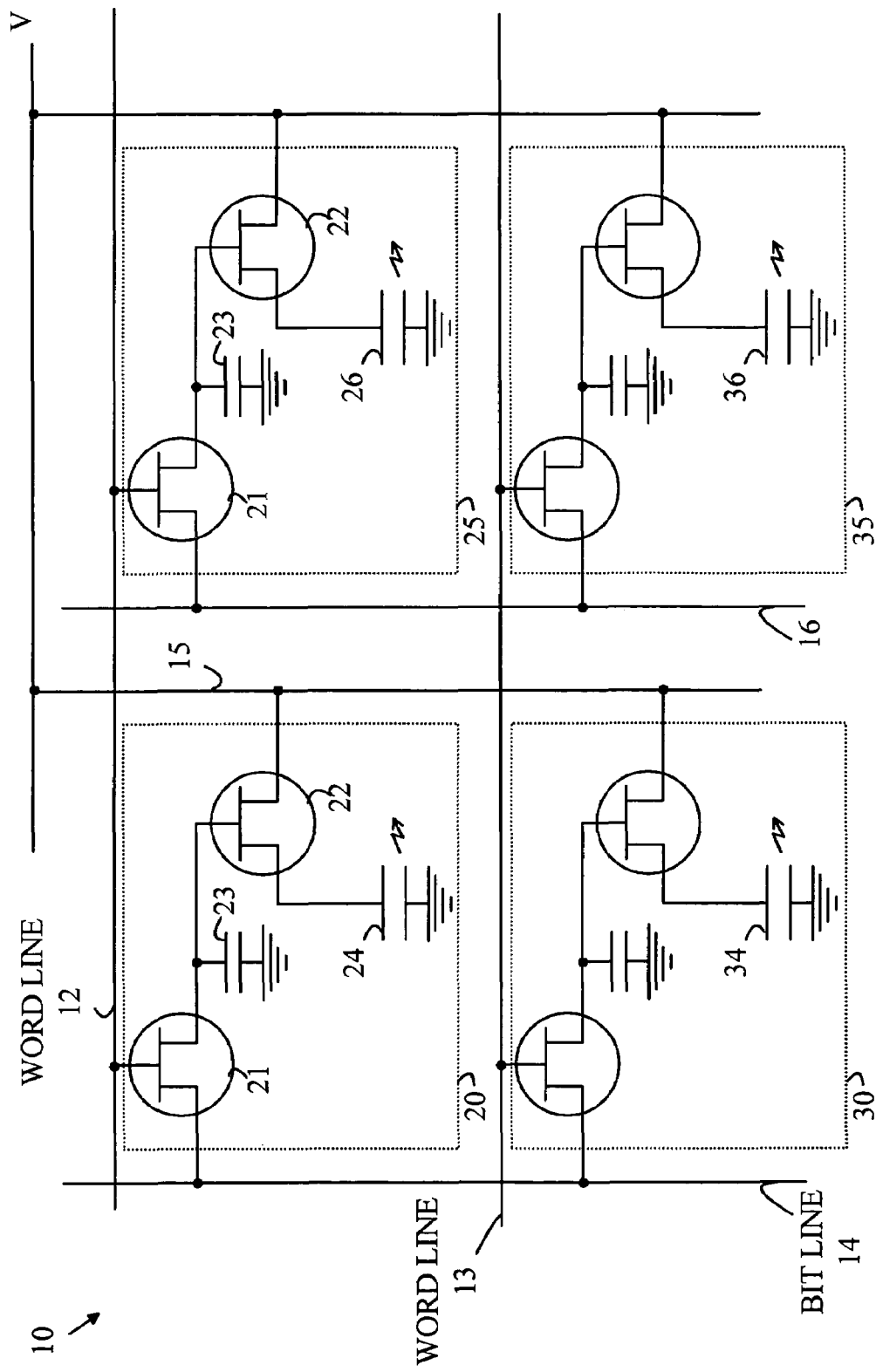
FIG. 1 is a schematic drawing of a portion of a display according to the present invention.

Refer now to FIG. 1 which is a schematic drawing of a portion of a display 10 according to the present invention. The portion of display 10 shown in FIG. 1 consists of four pixels 20, 25, 30, and 35. Each pixel consists of two TFT transistors, an OLED, and a capacitor for storing the intensity to be displayed by the OLED. The corresponding OLEDs are shown at 24, 26, 34, and 36. Referring to pixel 20, the current flowing through OLED 24 is determined by the voltage on the gate of TFT 22 and the supply voltage provided on bus 15. The voltage on the gate of TFT 22 is set by applying the desired voltage to a bit line 14 while placing gate TFT 21 in a conducting state. The voltage programs capacitor 23 with the voltage on the bit line.

The pixels are written in "words". All of the pixels connected to a particular word line are written in parallel by applying the desired programming voltages to the bit lines. Pixels 20 and 30 are programmed through bit line 14, and pixels 25 and 35 are programmed through bit line 16. The word selected for programming is selected by applying an appropriate logic voltage on a corresponding word line. Pixels 20 and 25 are selected via word line 12, pixels 30 and 35 are selected via word line 13.

A display according to the present invention is constructed by bonding an array of OLEDs to an array of TFTs. To simplify the following discussion, the fabrication of an array of OLEDs for a monochrome display will be described first. The manner in which a color display is fabricated will be discussed in more detail below.

Refer now to FIGS. 2 and 3 which illustrate an array of OLEDs 50 according to the present invention. FIG. 2 is a top view of array 50, and FIG. 3 is a cross-sectional view of array 50 through line 51–52 shown in FIG. 2. To clarify the various layers that make up array 50, the layers have been shown displaced from one another at the edges of the array. An array is constructed on a thin plastic substrate 61 constructed from a transparent polymer that is capable of withstanding the processing temperatures involved in depositing the various layers. The processing temperatures are typically less than 150° C. Substrates constructed from poly(ethylene terephthalate), or PET may be used. A transparent conducting layer 62 is deposited on the substrate. The preferred conducting material is ITO. Layer 62 becomes a common anode electrode which is shared by all of the OLEDs. The various polymer layers are then deposited on the anode electrode. These include any hole and electron transport layers as well as the electroluminescent layer. To simplify the drawing, these layers are shown as a single layer 63. Finally, a cathode layer is deposited and patterned to form individual cathode electrodes 64. By applying a voltage between a cathode electrode and the common anode electrode, the portion of the light emitting layer 62 under that cathode electrode is caused to emit light that escapes through the transparent plastic substrate 61.

Figure 4:
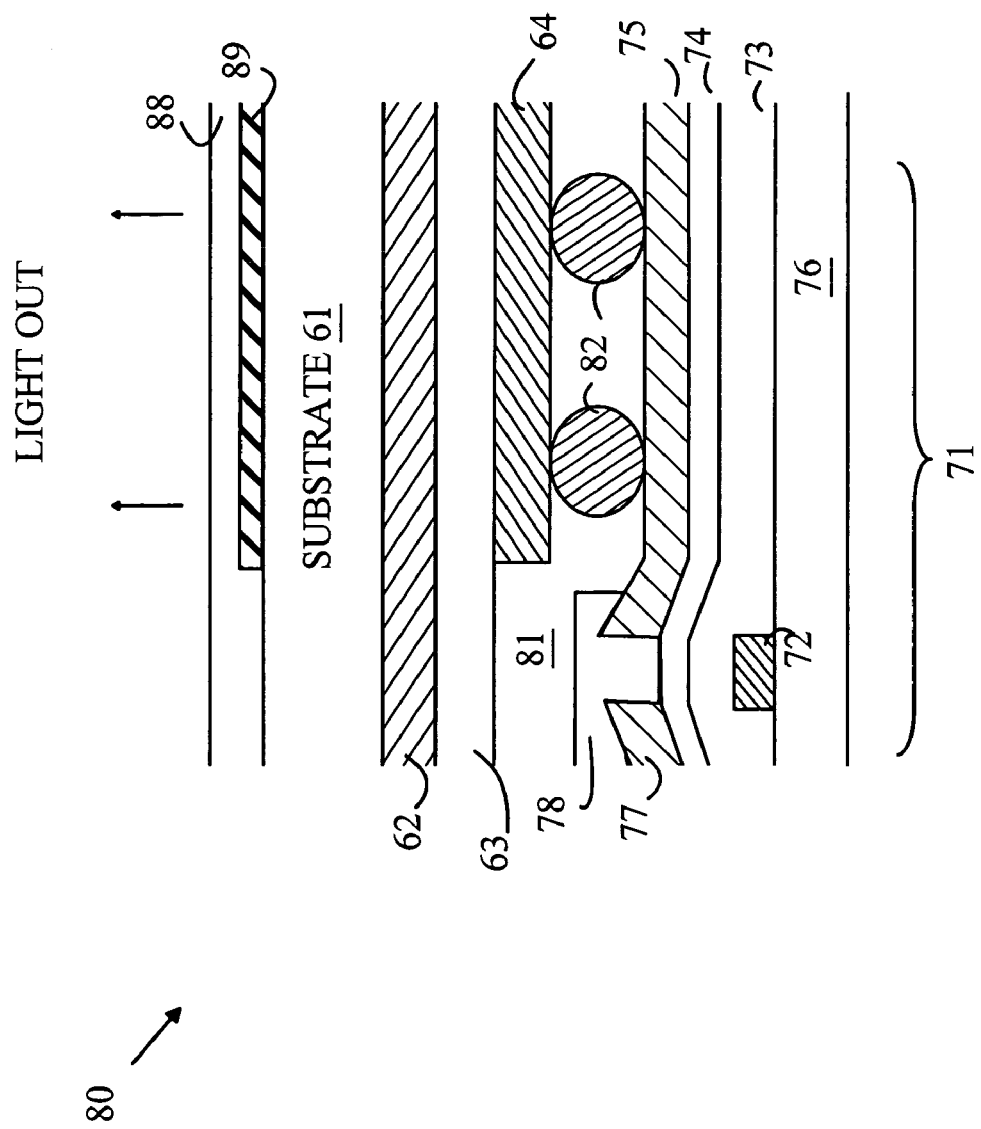
FIG. 4 is a cross-sectional view of a portion of a display according to the present invention illustrating the connection of the OLEDs to the driving transistors.

Array 50 is bonded to a substrate on which the TFTs and associated capacitors have already been fabricated utilizing an anisotropic conductive adhesive (ACA), which serves both to hold the two devices together and to make the necessary electrical contacts. ACAs suitable for this purpose are well known and are manufactured by Hitachi, 3M Corp., and Alpha metals, Inc. These adhesives are described in "Flip Chip Technologies", ed. John Lau (McGraw-Hill, 1996). Referring to FIG. 4, which is a cross-sectional view of a portion of a display 80 containing one pixel that is controlled by a TFT 71. TFT 71 is constructed on a glass substrate 76 having a SiN insulating gate oxide layer 73 which isolates gate 72 from a polysilicon layer 74. The drain and source of TFT 71 are shown at 75 and 77, respectively. The source electrode 77 is covered by an insulating layer 78.

TFT 71 is connected to the corresponding OLED by a layer of ACA 81 which bonds the drain 75 to the cathode 64 of the OLED. The electrical conduction is provided by compressible conducting particles 82 in an electrically insulating glue material. The array of OLEDs is pressed onto the array of TFTs to form the various contacts. Hence, it is advantageous to have an array of OLEDs that is constructed on a flexible substrate, as this allows sufficient flexing of the OLED array to assure that each OLED is connected to its corresponding TFT. Alignment of the two substrates is accomplished by an optical aligner of the type that is currently used for aligning the standard liquid crystal cells described above. The TFT substrate provides a solid barrier against permeation of water or oxygen into the OLED, leaving a requirement of only a single barrier 88.

The above described embodiment of the present invention was a monochromatic display. That is, all of the OLEDs generate the same wavelength light. Color displays require that pixels generate different color spectra. Typically, a color pixel is constructed from three pixels having red, green, and blue emitters.

Multicolor pixels may be provided by two approaches. The first approach consists of depositing emitting materials with different spectral characteristics. Each of these materials (typically one material with red emission, one for green and one for blue) is deposited separately in different parts of the substrate to achieve "full color" (RGB) pixels by separately powering the three color pixels. This technique requires the patterning of the electroluminescent layer 63 discussed above. Methods for patterning such layers are known in the art, and hence, will not be discussed in detail here.

The second approach consists of depositing a single emissive material and using (RGB) filters, resonant cavities and/or photoluminescent materials that can absorb the light from the emissive material and re-emit light at longer wavelengths (green and red). This approach requires the emissive material to have a substantial emission in the blue. Such wavelength converters are known in the art, and hence, will not be discussed in detail. The reader is directed to U.S. Pat. Nos. 5,121,214 and 5,294,820 for a discussion of such materials.

Devices based on color conversion are preferred because it is much easier to pattern the wavelength converters than electroluminescent materials. In addition, these devices do not require that the electroluminescent characteristics of three different emissive materials be balanced. In general, the voltage-current characteristics and quantum efficiencies are usually very different for each material. The lifetimes of the electroluminescent materials are also quite difficult to equalize between different materials.

In the preferred embodiment of the present invention, the color conversion materials are deposited on the opposite side of the plastic substrate from the ITO layer. Such a light converter is shown in FIG. 4 at 89.

While the above described embodiments of the present invention utilize a layer of an anisotropic conductive adhesive to bond the array of OLEDs to the array of TFTs, other bonding arrangements may be utilized. For example, a patterned conductive adhesive can be applied using screen printing or precision stencil printing techniques. Such adhesives are described in D. Durand, et al, "Electrically Conductive Cement Containing Agglomerate, Flake and Powder Metal Fillers", U.S. Pat. No. 5,180,523 and in K. Gilleo, "Polymer Bonding Systems Offer Alternatives to Soldering", Electronic Packaging and Production, December 1992, pp. 52–54. These techniques are used in printed circuit fabrication to apply conductive adhesives, and hence will not be described in detail here. The anisotropic conductive adhesive described above is preferred because no patterning or mask step is needed.

Various modifications to the present invention will become apparent to those skilled in the art from the foregoing description and accompanying drawings. Accordingly, the present invention is to be limited solely by the scope of the following claims.

What is claimed is:

1. A display comprising a plurality of light emitting pixels, each pixel comprising an isolation transistor, a driving circuit, and an organic light emitting diode (OLED), said driving circuit storing a value that determines the magnitude of the light emitted by that pixel, said driving circuit placing said OLED in a conducting path between first and second power terminals, said isolation transistor connecting said driving circuit to a bit line when said isolation transistor is placed in a conducting state by the application of a logic signal to a word line, wherein said OLEDs are part of an array of OLEDs, said array of OLEDs comprising:

a flexible sheet having first and second surfaces, said first and second surfaces being parallel to one another, said flexible sheet being transparent to light of a first wavelength;

a first electrode comprising a first electrode layer in contact with said first surface, said first electrode layer being transparent to light of said first wavelength;

a light emitting layer comprising an organic polymer in electrical contact with said first electrode layer; and a plurality of second electrodes, one such second electrode corresponding to each OLED, each of said second electrodes comprising an isolated conducting area in electrical contact with said light emitting layer, said light emitting layer generating light of said first wavelength in a region adjacent to said second electrode when a potential difference is applied across said first and second electrodes, wherein said driving circuit comprises a storage capacitor and a driving transistor, and wherein said driving transistor is part of a transistor array having a plurality of connection points disposed on a surface, each of said connection points corresponding to one of said second electrodes in said array of OLEDs, said connection points being arranged such that each second electrode overlies said corresponding connection point when said array of OLEDs is properly aligned with said transistor array, and wherein said display further comprises a bonding layer comprising an anisotropic conductive adhesive located between said transistor array and said array of OLEDs, said bonding layer being in contact with a plurality of said connection points, said bonding layer electrically connecting each of said second electrodes to that connection point corresponding to that second electrode without electrically connecting any one of said second electrodes to a connection point that does not correspond to that second electrode.

2. The display of claim 1 wherein said bonding layer comprises compressible electrically conducting particles suspended in an electrically insulating adhesive.

3. The display of claim 1 further comprising a light conversion layer in contact with said second surface of said flexible sheet, said light conversion layer absorbing light of said first wavelength and emitting light of a second wavelength.

4. The display of claim 1 wherein said driving transistor are part of an array of thin film transistors.

5. A display comprising a plurality of light emitting pixels, said display comprising an array of driving transistors and an array of OLEDs, said array of OLEDs comprising:

a flexible sheet having first and second surfaces, said first and second surfaces being parallel to one another, said flexible sheet being transparent to light of a first wavelength;

a first electrode comprising a first electrode layer in contact with said first surface, said first electrode layer being transparent to light of said first wavelength;

a light emitting layer comprising an organic polymer in electrical contact with said first electrode layer; and a plurality of second electrodes, one such second electrode corresponding to each OLED, each of said second electrodes comprising an isolated conducting area in contact with said light emitting layer, said light emitting layer generating light of said first wavelength in a region adjacent to said second electrode when a potential difference is applied across said first and second electrodes, wherein said array of driving transistors is part of a transistor array having a plurality of connection points disposed on a surface, each of said connection points corresponding to one of said second electrodes in said array of OLEDs, said connection points being arranged such that each second electrode overlies said corresponding connection point when said array of OLEDs is properly aligned with said transistor array, and wherein said display further comprises a bonding layer comprising an anisotropic conductive adhesive located between said transistor array and said array of OLEDs, said bonding layer being in contact with a plurality of said connection points, said bonding layer electrically connecting each of said second electrodes to that connection point corresponding to that second electrode without electrically connecting any one of said second electrodes to a connection point that does not correspond to that second electrode.

6. The display of claim 5 wherein said bonding layer comprises compressible electrically conducting particles suspended in an electrically insulating adhesive.

7. The display of claim 5 further comprising a light conversion layer in contact with said second surface of said flexible sheet, said light conversion layer absorbing light of said first wavelength and emitting light of a second wavelength.

8. The display of claim 5 wherein said driving transistor are part of an array of thin film transistors.

* * * * *